US012749541B2

(12) United States Patent
Chang et al.

(10) Patent No.: US 12,749,541 B2
(45) Date of Patent: Sep. 29, 2026

(54) CASCADE MODEL FOR DETERMINING READ LEVEL VOLTAGE OFFSETS BASED ON WORDLINE GROUP MEMORY CELLS

(71) Applicant: Micron Technology, Inc., Boise, ID (US)

(72) Inventors: Li-Te Chang, San Jose, CA (US); Charles S. Kwong, Redwood City, CA (US); Murong Lang, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 233 days.

(21) Appl. No.: 18/615,051

(22) Filed: Mar. 25, 2024

(65) Prior Publication Data

US 2024/0331777 A1 Oct. 3, 2024

Related U.S. Application Data

(60) Provisional application No. 63/455,827, filed on Mar. 30, 2023.

(51) Int. Cl.

| | |
|---|---|
| ***G11C 16/26*** | (2006.01) |
| ***G06N 20/00*** | (2019.01) |
| ***G11C 13/00*** | (2006.01) |
| ***G11C 16/04*** | (2006.01) |
| ***G11C 16/34*** | (2006.01) |
| ***G11C 29/42*** | (2006.01) |
| ***G11C 29/56*** | (2006.01) |

(52) U.S. Cl.

CPC ............. *G11C 16/26* (2013.01); *G06N 20/00* (2019.01); *G11C 16/0433* (2013.01); *G11C 16/3422* (2013.01); *G11C 16/3431* (2013.01); *G11C 29/42* (2013.01); *G11C 29/56008* (2013.01); *G11C 2013/0054* (2013.01); *G11C 16/0483* (2013.01)

(58) Field of Classification Search

CPC . G11C 16/26; G11C 16/0433; G11C 16/3422; G11C 16/3431; G11C 29/42; G11C 29/56008; G11C 16/0483; G11C 2013/0054; G11C 11/5642; G11C 16/08; G06N 20/00; G06N 3/08

See application file for complete search history.

(56) References Cited

U.S. PATENT DOCUMENTS

| | | | | |
|---|---|---|---|---|
| 2014/0229131 | A1* | 8/2014 | Cohen | G11C 16/3418 702/64 |
| 2015/0019922 | A1* | 1/2015 | Leem | G11C 16/3418 714/706 |
| 2021/0271416 | A1* | 9/2021 | Alhussien | G11C 16/26 |
| 2024/0126453 | A1* | 4/2024 | Ahn | G11C 16/26 |
| 2024/0304259 | A1* | 9/2024 | Su | G11C 16/26 |
| 2024/0312528 | A1* | 9/2024 | Nitzan | G11C 11/5642 |

OTHER PUBLICATIONS

Chang, Li-Te, "Model Based Error Avoidance", U.S. Appl. No. 18/383,712, filed Oct. 25, 2023, 44 pages.

* cited by examiner

*Primary Examiner* — Donald HB Braswell

(74) *Attorney, Agent, or Firm* — Schwegman Lundberg & Woessner, P.A.

(57) ABSTRACT

Various embodiments use a cascade model to determine (e.g., predict or estimate) one or more read level voltage offsets used to read data from one or more memory cells of a memory device, which can be part of a memory sub-system.

20 Claims, 9 Drawing Sheets

300

| BIN | 1 | 2 | 3 | 4 | 5 | 6 | 7 |
|---|---|---|---|---|---|---|---|
| Lv 1 | 0 | 0 | 2 | 0 | 0 | 4 | 5 |
| Lv 2 | -1 | -2 | -2 | -3 | -4 | -4 | -5 |
| Lv 3 | -2 | -4 | -4 | -6 | -8 | -8 | -9 |
| Lv 4 | -2 | -4 | -6 | -6 | -8 | -11 | -13 |
| Lv 5 | -3 | -6 | -7 | -9 | -12 | -14 | -17 |
| Lv 6 | -4 | -8 | -10 | -12 | -16 | -20 | -23 |
| Lv 7 | -6 | -12 | -15 | -18 | -24 | -30 | -36 |

310 320 322 330 332

*FIG. 3*

CASCADE MODEL FOR DETERMINING READ LEVEL VOLTAGE OFFSETS BASED ON WORDLINE GROUP MEMORY CELLS

PRIORITY APPLICATION

This application claims the benefit of priority to U.S. Provisional Application Ser. No. 63/455,827, filed Mar. 30, 2023, which is incorporated herein by reference in its entirety.

TECHNICAL FIELD

Embodiments of the disclosure relate generally to memory devices and, more specifically, to using a cascade model to determine one or more read level voltage offsets used to read data from one or more memory cells of a memory device, which can be part of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 is a block diagram of an example look-up table bin transition and read level voltage offset table, in accordance with some embodiments of the present disclosure.

DETAILED DESCRIPTION

Figure 1:
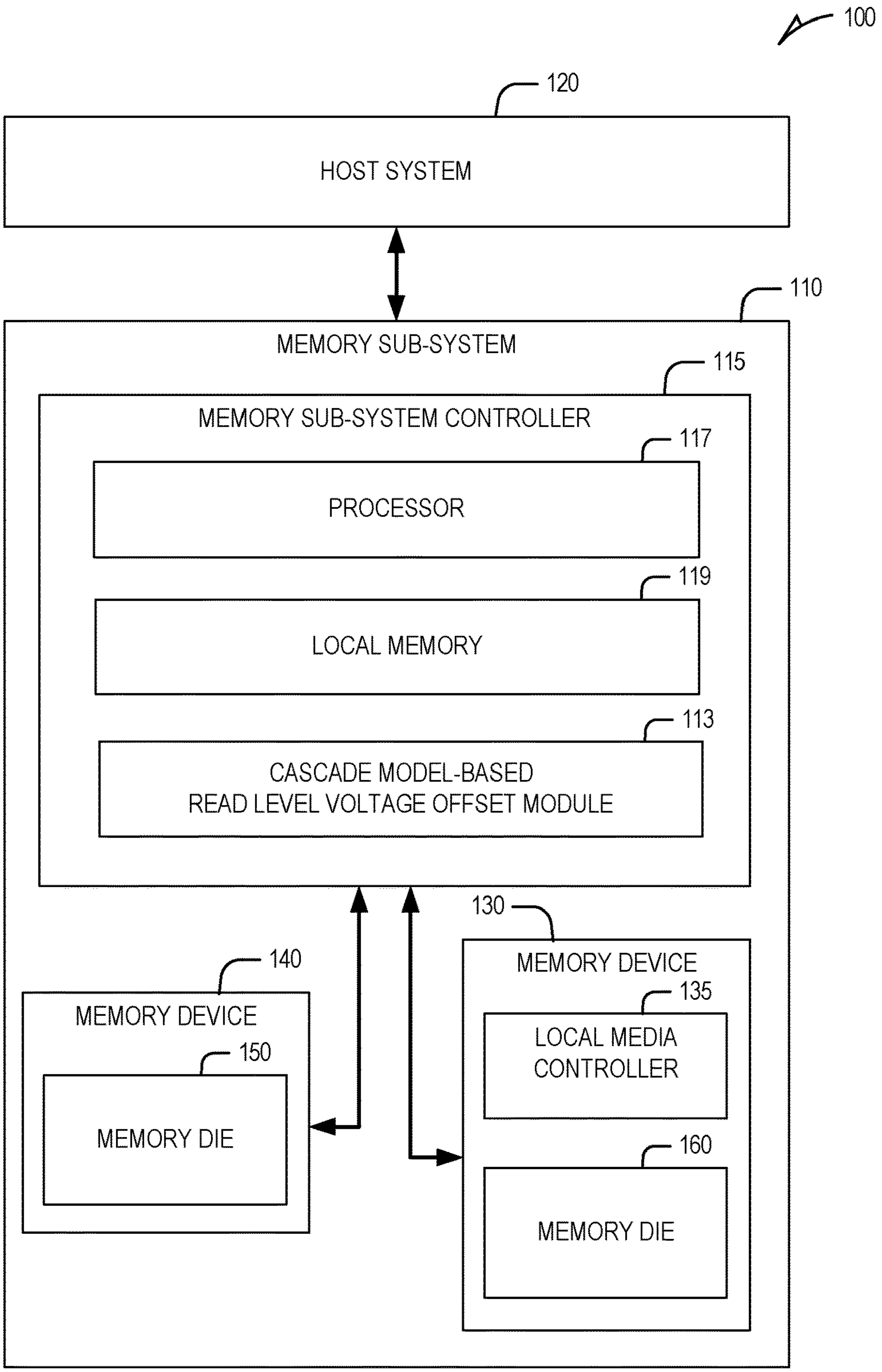
FIG. 1 is a block diagram illustrating an example computing system that includes a memory sub-system, in accordance with some embodiments of the present disclosure.

For memory devices (such as a NAND-based memory device), Slow Charge Loss (SCL) of memory cells is a major degradation mechanism for data retention (DR). In particular, due to the effects of SCL, memory cells have their voltage threshold (Vt) distributions lose charge, with the highest Vt distributions typically losing charge faster than lower Vt distributions. SCL is usually a function of time and temperature, and can also be susceptible to other factors, such as cycling degradation (e.g., more Vt distribution shift for End of Life (EOL) blocks than for Beginning of Life (BOL) blocks). SCL usually causes a memory cell's Vt distribution to shift lower (e.g., causes the Vt distribution valley to shift lower) right after the memory cell is programmed.

Accordingly, to compensate for SCL-based shift when performing a read operation on a memory cell, an offset (or read level voltage offset) is usually applied to one or more read level voltages (also referred to herein as read levels) used to read data from the memory cell. Generally, to read data from a memory cell, one or more read level voltages are applied to the gate of a transistor (of the memory cell) to determine (e.g., sense) the value of the current threshold voltage (e.g., the voltage at which the transistor conducts current), and the current threshold voltage value can be decoded (e.g., mapped) to a data value (e.g., bit string) stored by the memory cell. Traditionally, the read level voltage offset applied to a memory cell is determined based on SCL tracking. Tracking SCL of memory cells is crucial to avoiding excessive latency impact, which can be caused by unnecessary error handling that results from incorrect read level placement (which can occur if a read level voltage offset applied to a read level voltage causes it to be placed without considering SCL effect on Vt distributions). Intrinsically, the effects of SCL on a memory cell hold strong dependence on a wordline (WL) group of the memory cell due to process variation (process variation that existed when the memory cell was manufactured) and asymmetric bitline (BL) cross-section at each WL. For instance, the cross-section can be larger at the top of the WL of each deck and yield smaller effective field, or the cross-section can be smaller at the bottom of the WL of each deck and yield stronger effective field. Accordingly, traditional methods for SCL tracking perform periodic, proactive scans of blocks (comprising memory cells) and classify measured read level voltage offsets of scanned blocks into the predefined bins. Blocks with similar SCL characteristics can be grouped together in a bin to improve the management efficiency.

For example, a block family error avoidance (BFEA) algorithm (one example of SCL tracking) can scan blocks to determine the shift of read level 7 (LVL7 or L7). The determined shift of read level 7 can be categorized into a specific bin (e.g., BFEA bin), read level voltage offsets for read levels 1 through 7 can be determined from a look-up table (LUT) (e.g., BFEA LUT) based on the specific bin (e.g., from a column of the LUT corresponding to the specific bin), and the determined read level voltage offsets can be used in a read operation (e.g., host reads) for one or more of those blocks. For example, if the shift of read level 7 of a memory cell is-23 characterized by BFEA scan, the BFEA algorithm can determine (e.g., identify) a bin (e.g., BFEA bin) that is associated with the shift of −23 (e.g., bin 5 based on example Table 1, provided below), can determine read level voltage offsets for read levels 1 through 7 from the LUT (e.g., read level voltage offsets of bin 5's column of example Table 2, provided below) based on the determined bin (e.g., column associated with the bin), and can use the one or more determined read level voltage offsets in connection with a read operation for the memory cell.

TABLE 1

| BIN | 1 | 2 | 3 | 4 | 5 | 6 | 7 |
|---|---|---|---|---|---|---|---|
| Shift range | [−3, −8] | [−9, −13] | [−14, −16] | [−17, −21] | [−22, −26] | [−27, −32] | [−33, −>] |

TABLE 2

| BIN | 1 | 2 | 3 | 4 | 5 | 6 | 7 |
|---|---|---|---|---|---|---|---|
| LVL1 | | | | | | | |
| LVL2 | −1 | −2 | −2 | −3 | −4 | −4 | −5 |
| LVL3 | −2 | −4 | −4 | −6 | −8 | −8 | −9 |
| LVL4 | −2 | −4 | −6 | −6 | −8 | −11 | −13 |
| LVL5 | −3 | −6 | −7 | −9 | −12 | −14 | −17 |
| LVL6 | −4 | −8 | −10 | −12 | −16 | −20 | −23 |
| LVL7 | −6 | −12 | −15 | −18 | −24 | −30 | −36 |

Conventional SCL tracking methods, such as the BFEA algorithm, are based on a fixed LUT (e.g., BFEA LUT) with limited bin numbers, and unfortunately, as a result, it is challenging to improve (e.g., optimize) block scan trigger rate and manage the SCL variation based on WL groups, cycling degradation, and temperature. Various embodiments described herein can address these and other deficiencies of conventional technologies.

Aspects of the present disclosure are directed to using a cascade model (or a machine-learning (ML) cascade model) to determine one or more read level voltage offsets used to read data from one or more memory cells of a memory device, which can enable a memory sub-system to adaptively adjust one or more read level voltages used to read data from the memory cells. The memory sub-system controller can implement a cascade model that predicts (e.g., estimates) one or more read level voltage offsets to apply to one or more read level voltages of memory cells based on a determined (e.g., measured) read level voltage offset of an individual read level voltage. For example, the cascade model can predict read level voltage offsets for read level voltages 1 through 6 based on a read level voltage offset determined for a read level voltage 7 based on a scanning operation.

Some embodiments use a cascade model that adopts a cascade structure comprising stacks of machine-learning (ML) models (e.g., linear regression models), where each machine-learning model is designed for one or more attributes, such as memory cell attributes (e.g., wordline group (WLG), read level voltage, operating temperature of the memory cell, elapsed programming time of data of the memory cell, cycling of the memory cell, program erase count of the memory cell, etc.). For example, a machine-learning model of the cascade model can be a WLG-to-WLG machine-learning (ML) model (for WLG to WLG correlation), a read level-to-read level machine-learning (ML) model (for read level voltage offset to read level voltage offset correlation), or a temperature-to-temperature machine-learning model (for operating temperature to operating temperature correlation). For instance, a cascade model can be configured (e.g., designed) such that given a single measured read level voltage offset for a specific read level voltage (e.g., read level 7) of a specific WLG, the cascade model can determine (e.g., generate or output) a set of predicted read line voltage offsets for read level voltages 1 through 6 for the specific WLG and for read level voltages 1 through 7 for other WLGs, and the cascade model can perform this determination while handling a dynamic condition or workload. Machine-learning models for other memory cell attribute correlations can be used.

Some embodiments provide for a cascade model-assisted BFEA, where a LUT of the BFEA is updated or adapted using a plurality of read level voltage offsets determined (e.g., generated or outputted) by the cascade model based on a single measured read level voltage offset. Using the cascade model can provide the BFEA with flexibility and expandability for complex environments, such as different values of memory cell attributes (e.g., WLG, PEC, operating temperatures, etc.). Additionally, the cascade model can be trained using a supervised learning method adopted for offset prediction, which means the cascade model can be trained by given pairs of input/output test data.

Use of various embodiments can use a cascade model to improve accuracy of predicted read level voltage offsets, to simplify implementation of a system (e.g., implementation of BFEA) for compensating for SCL-based shift, to manage SCL in a dynamic working environment, or some combination thereof. The predicted read line voltage offsets from the cascade model can be used to update values stored in a look-up table of read level voltage offsets, which can improve execution of read requests received from a host. By adaptively and dynamically modifying predetermined read level voltage offsets stored in a look-up table based on predicted read level voltage offsets determined by a cascade model, the number of errors resulting from performing a read operation are reduced and the efficiency at which data is retrieved by applying one or more read level voltages to a memory cell is increased, thereby improving the overall efficiency of operating the memory sub-system.

As used herein, examples of a memory cell attribute include wordline group (e.g., worldline groups 1 through 16), read level voltage (e.g., one of levels 1 through 7 for a TLC memory cell), operating temperature of the memory cell or the memory device, elapsed programming time of data of the memory cell or the memory device, cycling of the memory cell or the memory device, program erase count (PEC) of the memory cell or the memory device, and the like.

As used herein, a machine-learning (ML) cascade model (or cascade model) comprises a plurality of machine-learning models, where the machine-learning models therein are stacked in a cascade structure. In this way, the machine-learning cascade model of an embodiment can implement a cascade ensemble of machine-learning models. For instance, a first stage of the cascade structure can comprise a single machine-learning model, and a second stage of the cascade structure can comprise two or more machine-learning models that each receive at least some portion of the output from the first stage as input and generate their own respective output, which can serve as input for a next stage of the cascade structure (if a next stage exists). According to some embodiments, each stage of the cascade structure comprises machine-learning model(s) associated with a feature, such as a memory cell attribute (e.g., wordline group, read level voltage, operating temperature, etc.). Each of the machine-learning models can be individually trained to determine (e.g., generate or output) a plurality of values (e.g., set of read level voltage offsets) associated with different values of a feature (e.g., different wordline groups) based on an input value (e.g., an input read level voltage offset) associated with a given value of the feature (e.g., a given wordline group). A machine-learning model of a cascade model can comprise, for example, at least one of an artificial neural network or a linear regression model.

As used herein, a memory device can be a non-volatile memory device, such as a NAND-type memory device that comprises multiple memory cells, each of which is configured to store data as electrical charge or voltage. A memory cell can comprise a transistor with a gate (e.g., a replacement gate or floating gate) that stores the electrical charge/voltage, and the electrical charge/voltage stored in the gate modifies voltage needed at the gate to turn the transistor. Specifically, a certain magnitude of electrical charge stored in the gate modifies the magnitude of threshold voltage of the transistor, and the threshold voltage can represent one or more units (e.g., bits) of data. The different types of memory cells support storage of different number of data units (e.g., bits). For instance, a memory cell of a memory device can be a single-level cell (SLC), a multiple-level cell (MLC), a triple-level cell (TLC), or a quad-level cell (QLC). The electrical charge stored in a memory cell that is (or used as) a SLC-type can result in a corresponding threshold voltage that represents one bit of stored data; an electrical charge stored in a memory cell that is (or used as) an MLC-type can result in a corresponding threshold voltage that represents two bits of stored data; an electrical charge stored in a memory cell that is (or used as) a TLC-type can result in a corresponding threshold voltage that represents three bits of stored data; and an electrical charge stored in a memory cell that is (or used as) a QLC-type can result in a corresponding threshold voltage that represents four bits of stored data. To read data from a memory cell, one or more read level voltages are applied to the gate of a transistor (of the memory cell) to determine (e.g., sense) the value of the current threshold voltage (e.g., the voltage at which the transistor conducts current), and the current threshold voltage value can be decoded (e.g., mapped) to a data value (e.g., bit string) stored by the memory cell. The number and values of read level voltages applied to the gate of a transistor (of a memory cell) can depend on the type of memory cell. For instance, a memory cell that is (or used as) a TLC can have seven different read level voltages, while a memory cell that is (or used as) a QLC can have fifteen read level voltages.

As used herein, a read level voltage (of a memory cell) can also be referred to as read levels. As used herein, a read level voltage offset can be applied to a read level voltage (or read level) for a memory cell, and can be applied as a read level voltage trim or voltage trim associated with the memory cell (e.g., adjustment value is applied to the stored voltage trim).

Certain non-volatile memory devices, such as NAND-type memory devices, comprise one or more blocks, (e.g., multiple blocks), with each of those blocks comprising multiple memory cells. For instance, a block can comprise multiple pages (also referred as wordlines), with each page comprising a subset of memory cells of the memory device. A non-volatile memory device can comprise a package of one or more die, where each die can comprise one or more planes. Each plane can comprise a set of physical blocks. For some memory devices, blocks are the smallest area that can be erased. Each block can comprise of a set of pages, and each page can comprise a set of memory cells, where each memory cell can store one or more bits of data. A memory device can be a raw memory device (e.g., a NAND-type memory device), which can be managed externally, for example, by an external controller. The memory device can be a managed memory device (e.g., managed NAND-type memory device), which is a raw memory device combined with a local embedded controller for memory management within the same memory device package.

Disclosed herein are some examples of using a cascade model (or a machine-learning cascade model) to determine one or more read level voltage offsets used to read data from one or more memory cells of a memory device, which can enable a memory sub-system to adaptively adjust one or more read level voltages used to read data from the memory cells.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, a secure digital (SD) card, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., a peripheral component interconnect express (PCIe) controller, serial advanced technology attachment (SATA) controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a SATA interface, a peripheral component interconnect express (PCIe) interface, USB interface, Fibre Channel, Serial Attached SCSI (SAS), Small Computer System Interface (SCSI), a double data rate (DDR) memory bus, a DIMM interface (e.g., DIMM socket interface that supports DDR), Open NAND Flash Interface (ONFI), DDR, Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random-access memory (SDRAM).

Some examples of non-volatile memory devices (e.g., memory device 130) include a NAND type flash memory and write-in-place memory, such as a three-dimensional (3D) cross-point memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional (2D) NAND and 3D NAND.

Each of the memory devices 130 can include one or more arrays of memory cells. One type of memory cell, for example, SLCs, can store one bit per cell. Other types of memory cells, such as MLCs, TLCs, QLCs, and penta-level cells (PLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks. As used herein, a block comprising SLCs can be referred to as a SLC block, a block comprising MLCs can be referred to as an MLC block, a block comprising TLCs can be referred to as a TLC block, and a block comprising QLCs can be referred to as a QLC block.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide-based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide-based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or another suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, and so forth. The local memory 119 can also include ROM for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130 and/or the memory device 140. The memory sub-system controller 115 can be responsible for other operations such as wear leveling operations, garbage collection operations, error detection and ECC operations, encryption operations, caching operations, and address translations between a logical address (e.g., LBA, namespace) and a physical memory address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 and/or the memory device 140 as well as convert responses associated with the memory devices 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 135) for media management within the same memory device package. An example of a managed memory device is a managed NAND (MNAND) device.

Each of the memory devices 130, 140 include a memory die 150, 160. For some embodiments, each of the memory devices 130, 140 represents a memory device that comprises a printed circuit board, upon which its respective memory dies 150, 160 is solder mounted.

The memory sub-system controller 115 includes a cascade model-based read level voltage offset module 113 that enables or facilitates the memory sub-system controller 115 to use a cascade model to determine (e.g., predict or estimate) one or more read level voltage offsets used to read data from one or more memory cells of one or both of the memory devices 130, 140.

Figure 2:
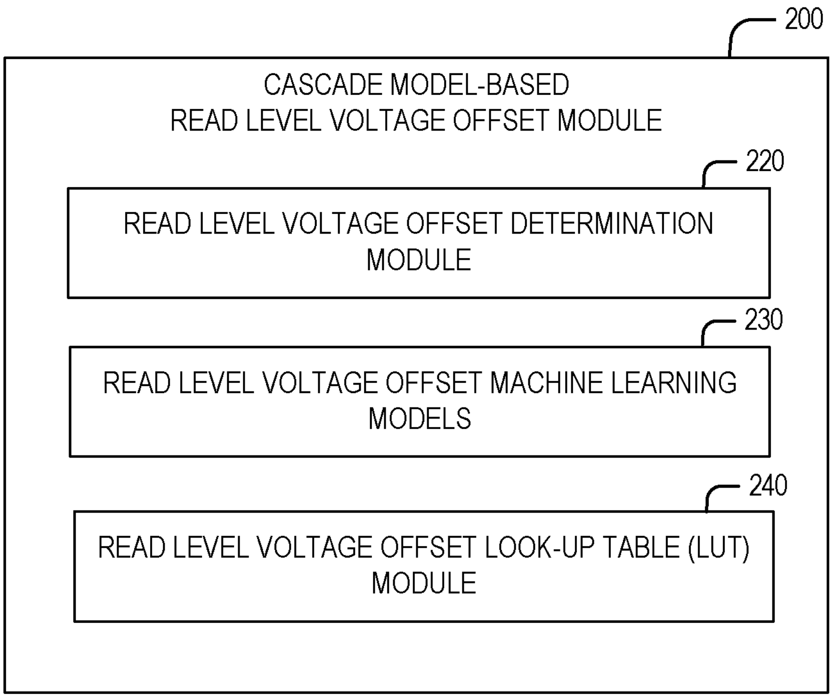
FIG. 2 is a block diagram of an example cascade model-based read level voltage offset module, in accordance with some embodiments of the present disclosure.

FIG. 2 is a block diagram of an example cascade model-based read level voltage offset module 200, in accordance with some embodiments of the present disclosure. The cascade model-based read level voltage offset module 200 can represent the cascade model-based read level voltage offset module 113 of FIG. 1. As illustrated, the cascade model-based read level voltage offset module 200 includes a read level voltage offset determination module 220, read level voltage offset machine-learning models 230 (hereafter, the machine-learning models 230), and a read level voltage offset look-up table (LUT) module 240 (hereafter, the LUT module 240).

The cascade model-based read level voltage offset module 200 can periodically perform a scan of the memory sub-system 110, particular memory device (e.g., 130, 140), or particular memory cells thereof using the read level voltage offset determination module 220. The scan can be used to determine a select read level voltage offset for a particular read level voltage of one or more memory cells of the particular memory device, such as read level 7. To scan the one or more memory cells of the particular memory device, the read level voltage offset determination module 220 performs a plurality of reads using different read level voltage offsets of a select read level voltage, and the charge readings obtained as a result of each read are used to determine whether the read was successful, such as based on a quantity of errors resulting from decoding data from the read performed at a particular read level voltage offset. The read level voltage offset that results in a read operation at the select read level voltage with the fewest errors can be selected and used as the (determined) select read level voltage offset for the select read level voltage. For some embodiments, this (determined) select read level voltage offset can be used to select or identify a given bin of a plurality of bins of read level voltage offsets.

Referring now to FIG. 3, FIG. 3 is a block diagram of an example look-up table 300 bin transition and read level voltage offset table 300, in accordance with some embodiments of the present disclosure. The read level voltage offset table 300 includes a plurality of bins 310 (e.g., BIN 1, BIN 2, BIN 3, BIN 4, and so forth). Each bin can be associated with a respective time interval that data has been stored to one or more memory cells the memory device (e.g., 130, 140). Additionally, each bin can be associated with a respective set of read level voltage offsets for each of a plurality of read level voltages (e.g., read levels 1 through 7) of one or more memory cells of the memory device. The read level voltage offset table 300 can be implemented as part of the LUT module 240.

For example, a first bin (e.g., BIN 5) of the bins 310 can include various read level voltage offsets 332 and 322 for respective voltage levels 330 and 320 of memory cells of the memory device. During a read operation performed on the memory device, the LUT module 240 can receive the read level voltage offset determined for the select read level voltage by the read level voltage offset determination module 220. The LUT module 240 can search all of the read level voltage offsets (e.g., −6, −12, −15, −18, −24, −30, and −36) stored across the various bins 310 for the select read level voltage (e.g., read level 7) to find a range of read level voltage offsets that corresponds to the read level voltage offset determined for the select read level voltage. If the read level voltage offset determination module 220 determines that the select read level voltage (e.g., read level 7) corresponds to the read level voltage offset value that falls within the read level voltage offset range defined by the read level voltage offset 322, the LUT module 240 can select or determine that the bin corresponding to the read level voltage offset 322 is a current bin for the memory cells of the memory device (e.g., the page, block, superblock, etc.).

Returning to FIG. 2, the LUT module 240 communicates the read voltage level offset 322 to the machine-learning models 230 to predict the read level voltage offsets for other read level voltages that are in the same first bin (e.g., BIN 5) as the bin determined to be current for the select read level voltage (e.g., read level 7), and predict read level voltage offsets for read level voltages for different attributes (e.g., memory cell attributes, such as WLG, PEC, operating temperature, etc.). The machine-learning models 230 implements a machine-learning cascade model (or a cascade model) that has been trained to determine (e.g., predict or estimate) two or more predicted read level voltage offsets for different read level voltages and for different values of different attributes of the memory device based on a determined (e.g., measured) read level voltage offset of a given read level voltage (e.g., read level 7 of memory cells associated with a given attribute, such a WLG 5). The LUT module 240 receives the one or more determined (e.g., predicted) read level voltage offsets that have been determined by the machine-learning models 230 and updates one or more values stored in the read level voltage offset table 300 for corresponding read level voltages and for corresponding attributes (e.g., corresponding memory cell attributes). For example, the LUT module 240 updates the current value (e.g., −8) of the read level voltage offset 332 stored in the first bin (e.g., BIN 5) for a second read level voltage (e.g., read level 4) with a new value determined by the machine-learning models 230. The LUT module 240 can perform this update for each value of read level voltage offset stored in the read level voltage offset table 300 for bins that are determined (e.g., predicted or estimated) by the machine-learning models 230.

The cascade model-based read level voltage offset module 200 can receive a request from a host to read data from the memory device. In response, the cascade model-based read level voltage offset module 200 can use current values stored in the LUT module 240 for a bin corresponding to a time period representing a duration of time data has been stored in the memory device. The LUT module 240 can then read the requested data from memory cells of the memory device using the read level voltage offsets of the currently assigned bin (the bin corresponding to the duration of time data has been stored or the bin that includes a read level voltage offset range that corresponds to a determined select read level voltage offset for a select read level voltage). In response, the machine-learning models 230 access the bin associated with the one or more memory cells of the memory device to retrieve a read level voltage offset and then read the one or more memory cells based on a read level voltage offset defined by the bin for one or more read level voltage. Similar techniques can be applied to one or more additional tables that each stores different read level voltage offsets for different read level voltages associated with different attributes (e.g., memory cell attributes, such as WLG, temperature, or PEC) of the memory sub-system.

Figure 4:
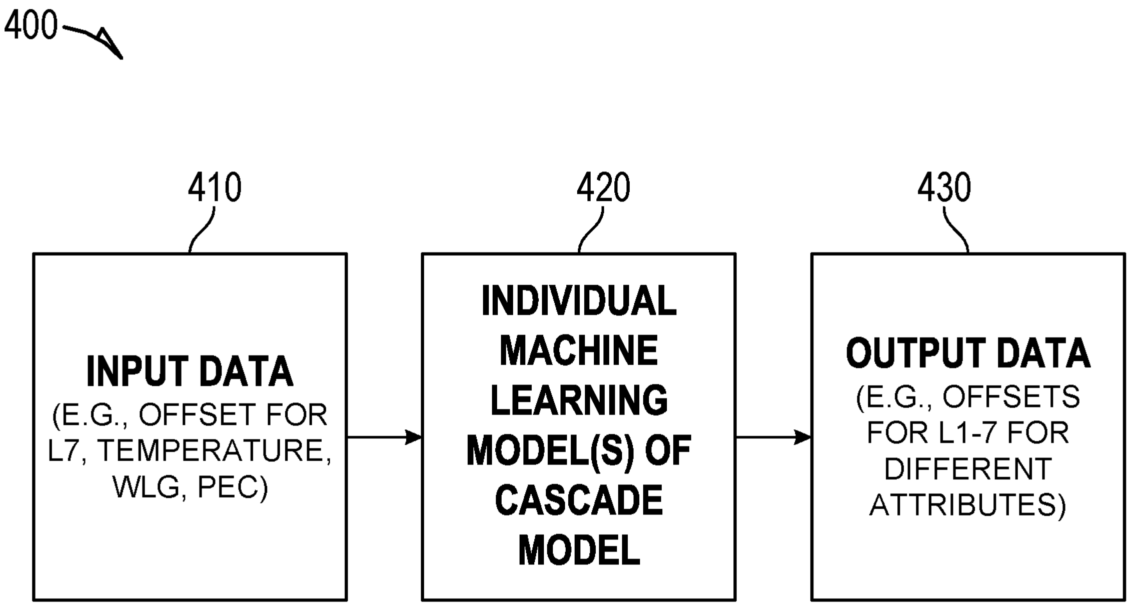
FIG. 4 is a diagram illustrating training of a cascade model, in accordance with some embodiments of the present disclosure.

FIG. 4 is a diagram 400 illustrating training of a cascade model, in accordance with some embodiments of the present disclosure. The training in accordance with the diagram 400 can be performed during device manufacture or at runtime of the memory sub-system 110. One or more individual machine-learning models 420 of a cascade model can receive a set of training data 410. The one or more individual machine-learning models 420 (hereafter, the machine-learning models 420) can represent models of one or more stages of the cascade model. The training data 410 can include various features, such as a plurality of read level voltage offsets of a read level voltage and associated with one or more different attributes, such as operating temperatures, WLG, PEC, and the like with corresponding ground truth (known) read level voltage offsets for one or more other read level voltages given the same one or more attributes (e.g., temperatures, WLG, PEC, and the like). For some embodiments, the machine-learning models 420 are regression models (e.g., linear regression models), which can be trained based on regression to establish a relationship and compute coefficients that result in the determination (e.g., predication or estimation) of the read level voltage offsets for the one or more other read level voltages (e.g., read level voltage offset for read level 5) based on an input read level voltage offset of a select read level voltage (e.g., read level 7).

For example, an individual model of the machine-learning models 420 can select a first subset of the training data corresponding to a first instance of a first read level voltage offset for a first read level (e.g., read level 7) based on the various other factors (e.g., temperature, WLG, PEC, bin, and so forth). The individual model can use the first read level voltage offset and the various other factors to predict a read level voltage offset for another read level voltage (e.g., read level 5) and provide the predicted read level voltage offset among the output data 430. For some embodiments, the individual model can use a log-linear model to predict (e.g., estimate) the read level voltage offset for the other read level voltage. The individual model can obtain the ground truth read level voltage offset for the other read level voltage from the first subset of the training data based on the same set of factors. The individual model can compute a deviation between the predicted read level voltage offset for the other read level voltage and the ground truth read level voltage offset for the other read level voltage. The individual model can then update one or more parameters of the individual model based on the deviation and can repeat this process for multiple other read level voltages (e.g., read levels 1, 2, 3, 4, and 6) and for multiple other subsets of training data until one or more stopping criteria are reached. At that point, the individual model can be included as part of the machine-learning model 230 of the memory sub-system 110. The machine-learning models 420 as trained are used during runtime to predict read level voltage offsets for other read level voltages associated with different attributes (e.g., memory cell attributes) given an input read level voltage offset for a given read level voltage (e.g., the determined or measured read level voltage offset for the given read level voltage).

Machine learning is a field of study that gives computers the ability to learn without being explicitly programmed. Machine learning explores the study and construction of algorithms, also referred to herein as tools, that may learn from existing data and make predictions about new data. Such machine-learning tools operate by building a model from example training data in order to make data-driven predictions or decisions expressed as outputs or assessments. Although examples are presented with respect to a few machine-learning tools, the principles presented herein may be applied to other machine-learning tools. Depending on the embodiment, different machine-learning tools can be used to implement a cascade model. For example, linear regression, Logistic Regression (LR), Naive-Bayes, Random Forest (RF), artificial neural networks (ANN), deep NN (DNN), matrix factorization, and Support Vector Machines (SVM) tools can be used.

The machine-learning algorithms generally use features for analyzing the data to determine (e.g., generate) an output. Each of the features can comprise an individual measurable property of a phenomenon being observed (e.g., value of a memory cell attribute, such as WLG, operating temperature, or PEC). The concept of a feature is related to that of an explanatory variable used in statistical techniques such as linear regression. Features can be of different types, such as numeric features, strings, and graphs. Depending on the embodiment, the features can be of different types and can include one or more of attributes. The machine-learning algorithms use the training data to find correlations among the identified features that affect the determined (e.g., generated) outcome. In some examples, the training data includes labeled data, which is known data for one or more identified features and one or more outcomes, such as predicated (e.g., estimated) read level voltage offsets for one or more read level voltages given a known or determined read level voltage offset for another read level voltage.

With the training data and the identified features, the machine-learning tool can be trained by a machine-learning program training. The machine-learning tool can appraise the value of the features as they correlate to the training data. The result of the training is the trained machine-learning model. When the trained machine-learning model is used to perform a prediction (e.g., estimation, or projection, etc.), new data is provided as an input to the trained machine-learning model, and the trained machine-learning model generates an output based on the inputted data.

The machine-learning model can support two types of phases: a training phase and a prediction phase. In training phases, supervised, unsupervised, or reinforcement learning can be used. For example, the machine-learning model can (1) receive features (e.g., as structured or labeled data in supervised learning) and/or (2) identifies features (e.g., unstructured or unlabeled data for unsupervised learning) in training data. In prediction phases, the machine-learning model can use the features for analyzing determined read level voltage offsets of a given read level voltage and one or more attribute values (e.g., operating temperature, PEC, and so forth) to generate outcomes or predictions for read level voltage offsets for other read level voltages, which can be associated with similar or different attribute values.

Figure 5:
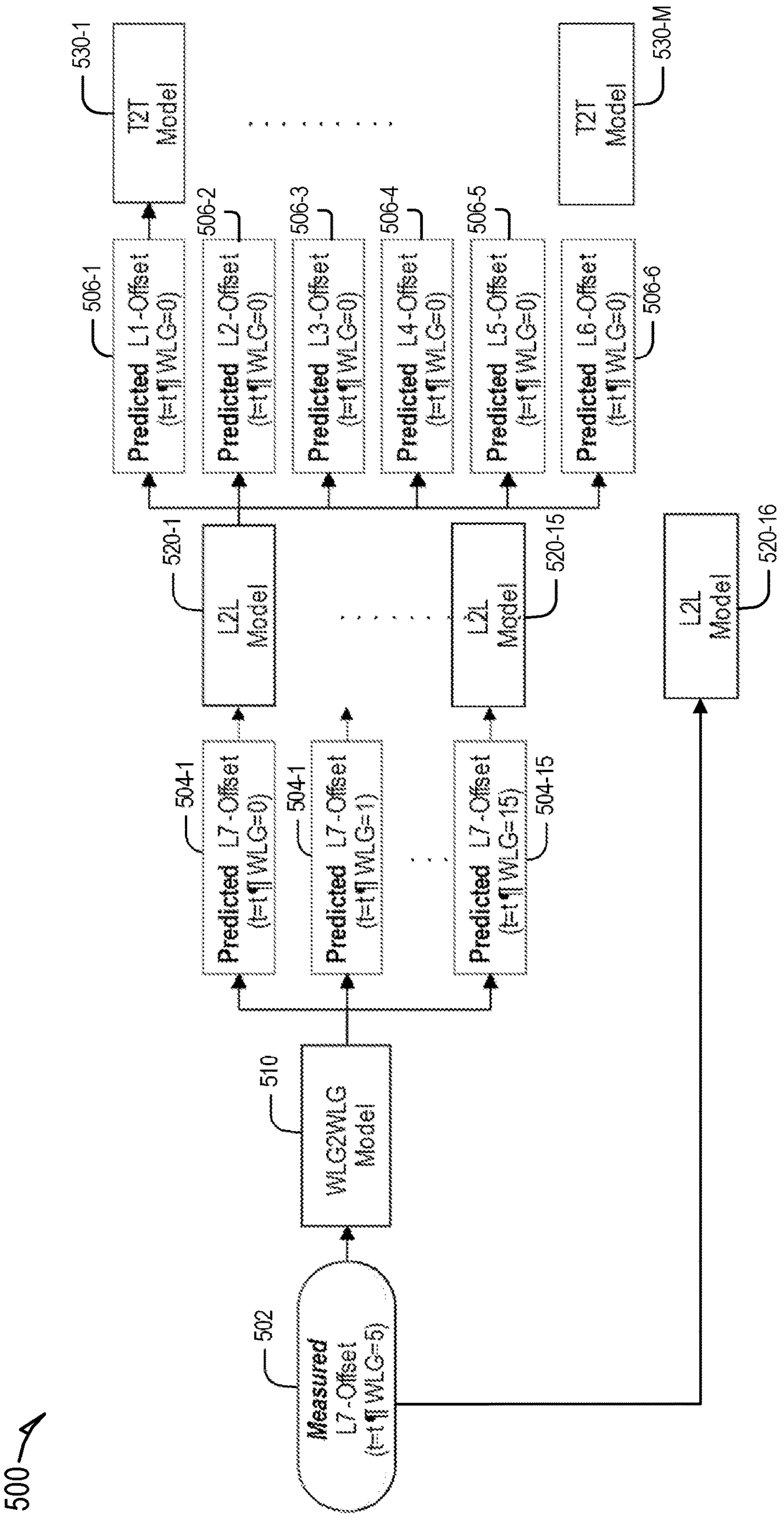
FIG. 5 is a diagram illustrating an example cascade model, in accordance with some embodiments of the present disclosure.

FIG. 5 is a diagram illustrating an example cascade model 500, in accordance with some embodiments of the present disclosure. In particular, the cascade model 500 as shown in FIG. 5 comprises ML models trained and arranged in a cascade structure for determining predicted read level voltage offsets for read level voltages 1 through 7 and for 16 different wordline groups (WLGs) based on a single determined (e.g., measured) read level voltage offset for a given read level voltage for a given WLG (e.g., single measured read level voltage offset for read level 7). In this way, the cascade model 500 can handle dynamic conditions and workloads (e.g., different combinations of memory cell attributes).

In FIG. 5, the cascade model 500 comprises a wordline group-to-wordline group (WLG2WLG) machine-learning (ML) model 510, and read level-to-read level (L2L) machine-learning (ML) models 520-1 through 520-16 (collectively referred to herein as L2L models 520), where the WLG2WLG ML model 510 implements a first stage of the cascade model 500, and where the L2L models 520 implement a second stage of the cascade model 500. In addition to the stages of the cascade model 500 comprising a ML model (e.g., WLG2WLG model 510) trained for predicting read level voltage offsets for a given read level voltage (e.g., read level 7) for different WLGs, and ML models (e.g., L2L model 520) trained for predicting read level voltage offsets for different read level voltages, the cascade model 500 of some embodiments comprises one or more different or additional stages that each comprise ML models associated with other attributes (e.g., memory cell attributes), such as operating temperature, PEC, and cycling. For instance, as shown, the cascade model 500 can comprise an additional stage of temperature-to-temperature (T2T) machine-learning (ML) models 530-1 through 530-M (collectively referred to herein as T2T models 530) for each different WLG, where each of the ML models 530 can receive as input a read level voltage offset associated with a specific read level voltage (e.g., read level 1), a specific operating temperature (e.g., represented by 1), and a specific WLG (e.g., WLG 0), and can determine one or more predicted read level voltage offsets for different operating temperature values.

During operation (e.g., update of one or more values of a LUT described herein), a read level voltage offset of a read level 7 (hereafter, L7-offset) can be determined (e.g., measured) for wordline group 5 (WLG5), and this determined L7-offset can be provided as input (502) to the WLG2WLG model 510, which represents the first stage of the cascade model 500. In response, the WLG2WLG model 510 can generate L7-offsets (504-1 through 504-15) for the other WLGs, namely WLGs 1 through 4 and 6 through 16. Thereafter, for each WLG, a corresponding one of the L2L models 520-1 through 520-16 receives as input a corresponding L7-offset (e.g., the L2L models 520-1 through 520-15 receive their respective L7-offsets from the output of the WLG2WLG model 510, and the L2L models 520-16 receives the L7-offset for WLG5 as determined directly from the input), and each of the L2L models 520-1 through 520-16 determine predicted read level voltage offsets 1 through 6 for their respective WLG (e.g., the L2L models 520-1 for WLG1, the L2L models 520-2 for WLG2 and so on). Using a single determined (e.g., measured) read level voltage offset to determine predicted read level voltage offsets, namely read level voltage offsets for read level voltages 1 through 6 for WLG 5 and read level voltage offsets for read level voltages 1 through 7 for WLGs 1 through 4 and 6 through 16, can permit an embodiment to save bandwidth. Eventually, the predicted read level voltage offsets determined by the different stages of the cascade model 500 can be used to update or replace corresponding values of read level voltage offsets stored in the LUT described herein.

The WLG2WLG model 510, and each of the L2L models 520-1 through 520-16, can comprise a linear regression ML model, and can be generated or trained using supervised linear regression (e.g., trained and validated by test data). For example, the training of the WLG2WLG model 510 can comprise 16 regressions for 16-WLGs, the training of each of the L2L models 520-1 through 520-16 can comprise 16×7 regressions for a total combination of 16 WLGs and 7 read levels.

Figure 6:
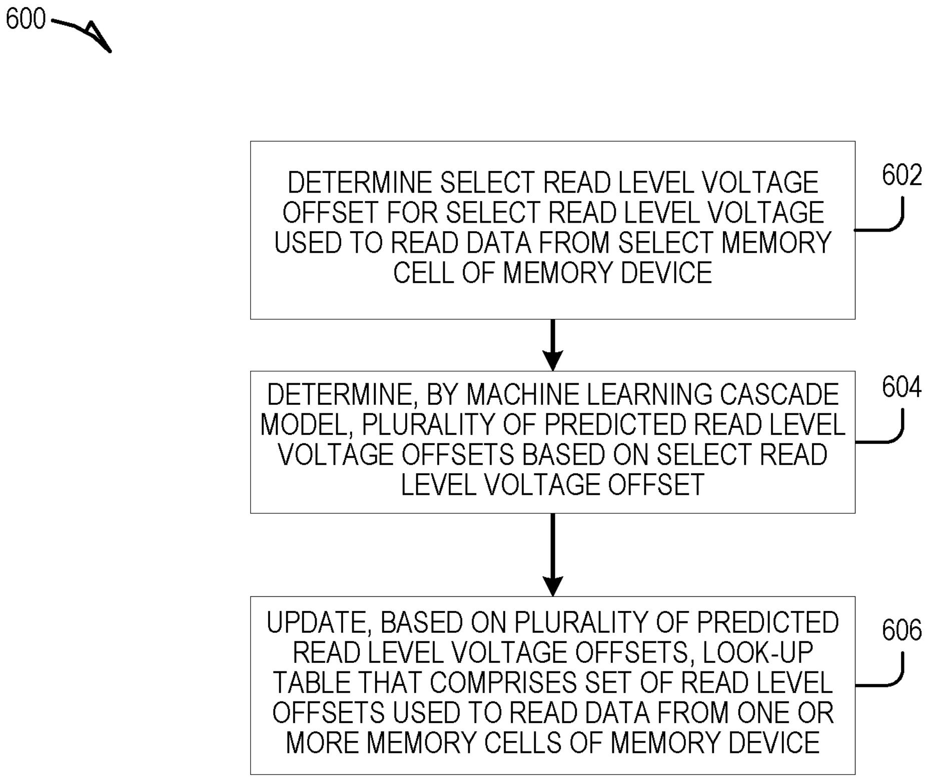
FIGS. 6 and 7 are flow diagrams of example methods for using a cascade model to determine one or more read level voltage offsets used to read data from one or more memory cells of a memory device, in accordance with some embodiments of the present disclosure.
Figure 7:
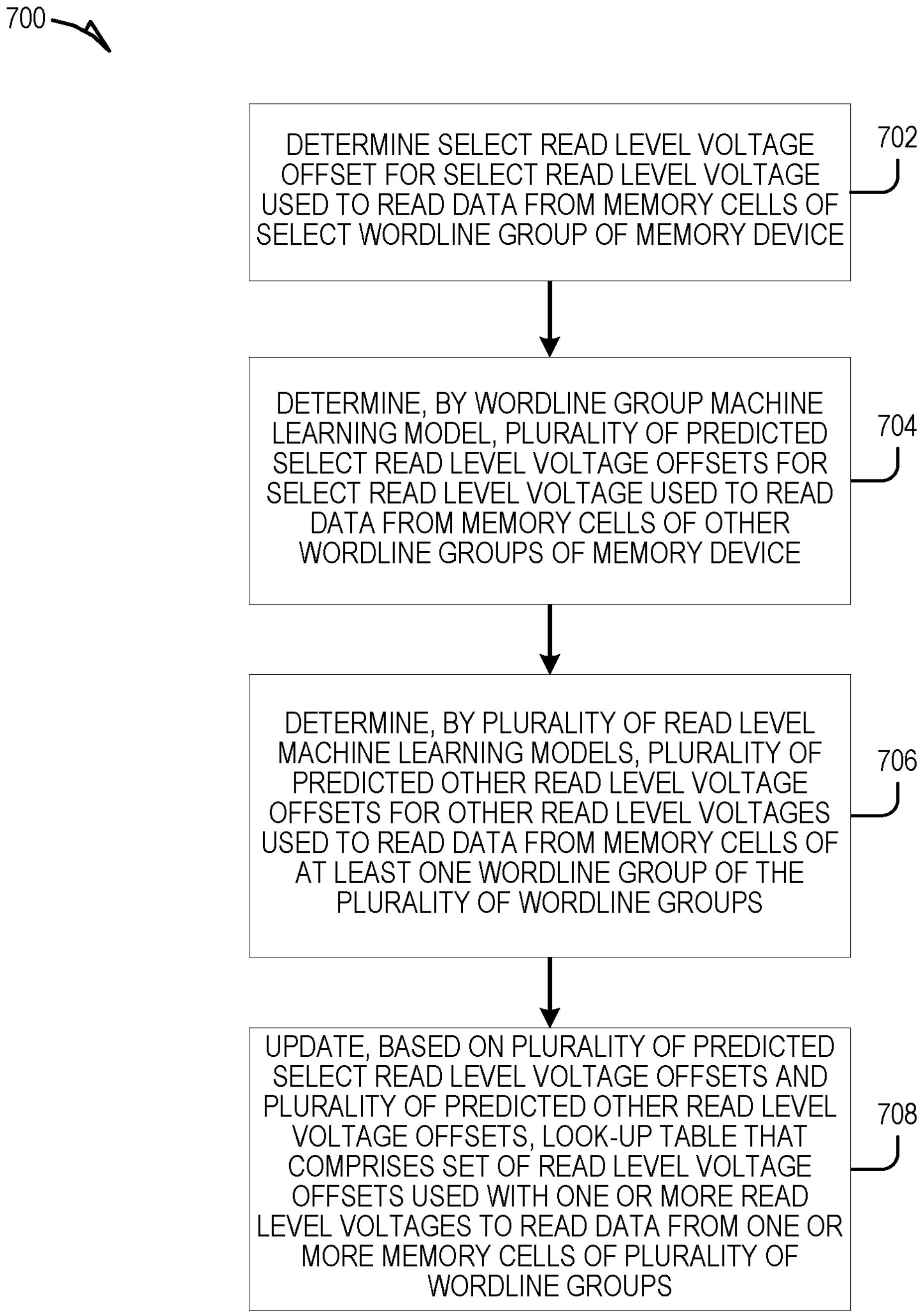

FIGS. 6 and 7 are flow diagrams of example methods for using a cascade model to determine one or more read level voltage offsets used to read data from one or more memory cells of a memory device, in accordance with some embodiments of the present disclosure. The methods 600, 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, at least one of the methods 600, 700 is performed by the memory sub-system controller 115 of FIG. 1 based on the cascade model-based read level voltage offset module 113. Additionally, or alternatively, for some embodiments, at least one of the methods 600, 700 is performed, at least in part, by the local media controller 135 of the memory device 130 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are used in every embodiment; other process flows are possible.

Referring now to the method 600 of FIG. 6, at operation 602, a memory controller (e.g., the memory sub-system controller 115) determines (e.g., measures) a select read level voltage offset for a select read level voltage used to read data from a select memory cell of a memory device (e.g., 130, 140). For example, the select read level voltage can correspond to a highest read level voltage used to read data from memory cells of the memory device. For instance, the select read level voltage can be read level 7 (e.g., where the memory cells are TLCs). Additionally, the select read level voltage can be associated with a particular wordline group of the memory device. For some embodiments, operation 602 is performed during, or as part of, a scan process performed on the memory device or on one or more select memory cells of the memory device. For example, the scan operation can comprise applying (e.g., gradually applying) different read level voltages to at least one memory cell, determining whether an individual one of the different read level voltages reaches a center of valley (CoV), and in response to determining that the individual one of the different read level voltages reaches the center of valley, determining that the select read level voltage offset has been reached.

During operation 604, the memory controller determines, by a machine-learning cascade model, a plurality of predicted read level voltage offsets based on the select read level voltage offset determined by operation 602. For some embodiments, the machine-learning cascade model comprises a plurality of stages, where each stage of the plurality of stages is associated with a different memory cell attribute of the memory device and comprises a set of machine-learning models (e.g., the WLG2WLG model 510 or the L2L models 520-1 through 520-16). Depending on the embodiment, the different memory cell attribute can comprise at least one of a WLG, an operating temperature, an elapsed programming time of data, cycling, a PEC. Each machine-learning model of the set of machine-learning models can be configured to receive an input read level voltage offset and be trained to determine two or more predicted read level voltage offsets for different values of the different memory cell attribute based on the input read level voltage offset. For example, the WLG2WLG model 510 can be configured to receive L7-offset with respect to WLG5, and can be trained to determine L7-offsets for WLGs 1 through 4 and 6 through 16. In another instance, the L2L model 520-1 can be configured to receive a L7-offset of WLG1 (e.g., from the WLG2WLG model 510), and can be trained to determine read level voltage offsets for read levels 1 through 6 for WLG1. Depending on the embodiment, each of the plurality of read level machine-learning models can comprise at least one of an artificial neural network or a linear regression model. One or more of the plurality of machine-learning models can be trained during manufacture of the memory system (e.g., memory sub-system).

At operation 606, the memory controller updates, based on the plurality of predicted read level voltage offsets determined by operation 604, a look-up table that comprises a set of read level voltage offsets used to read data from one or more memory cells of the memory device. Depending on the embodiment, the look-up table can comprise a plurality of tables, where each table of the plurality corresponds to a different set (e.g., combination) of memory cell attributes. For some embodiments, the set of read level voltage offsets of the look-up table is organized according to bins, and the updating of the look-up table based on the plurality of predicted read level voltage offsets (e.g., 504-1 through 504-15, and 506-1 through 504-6 for each WLG) comprises: identifying a plurality of bins of the look-up table corresponding to the select read level voltage offset; and replacing, in the set of read level voltage offsets, values of the plurality of bins with respective ones of the plurality of predicted read level voltage offsets. To update the look-up table periodically, the method 600 can be performed on a periodic basis.

Referring now to the method 700 of FIG. 7, the method 700 illustrates a particular implementation of the method 600 using the cascade model 500 of FIG. 5. At operation 702, a memory controller (e.g., the memory sub-system controller 115) determines (e.g., measures) a select read level voltage offset for a select read level voltage (e.g., read level 7) used to read data from one or more memory cells of a select wordline group (e.g., WLG5) of the memory device (e.g., 130, 140).

During operation 704, the memory controller determines (e.g., predicts), by a wordline group machine-learning model (e.g., 510), a plurality of predicted select read level voltage offsets (e.g., 504-1 through 504-16) for the select read level voltage (e.g., read level 7) used to read data from memory cells of other wordline groups (e.g., WLGs 1 through 4 and 6 through 16) of the plurality of wordline groups (e.g., WLGs 1 through 16).

Based on the plurality of predicted select read level voltage offsets (determined by operation 704) and the select read level voltage offset (determined by operation 702), the memory controller at operation 706 determines, by a plurality of read level machine-learning models (e.g., 520-1 through 520-16 for each WLG), a plurality of predicted other read level voltage offsets (e.g., 506-1 through 506-6) for other read level voltages (e.g. read levels 1 through 6) used to read data from memory cells of at least one wordline group of the plurality of wordline groups.

Eventually, at operation 708, the memory controller updates, based on the plurality of predicted select read level voltage offsets (determined by operation 704) and the plurality of predicted other read level voltage offsets (determined by operation 706), a look-up table that comprises a set of read level voltage offsets used with one or more read level voltages to read data from one or more memory cells of the plurality of wordline groups. Depending on the embodiment, the look-up table can comprise a plurality of tables, where each table of the plurality corresponds to a different set (e.g., combination) of memory cell attributes. For example, the look-up table can comprise a plurality of tables, where each table can correspond to a different wordline group of the plurality of wordline groups.

Figure 8:
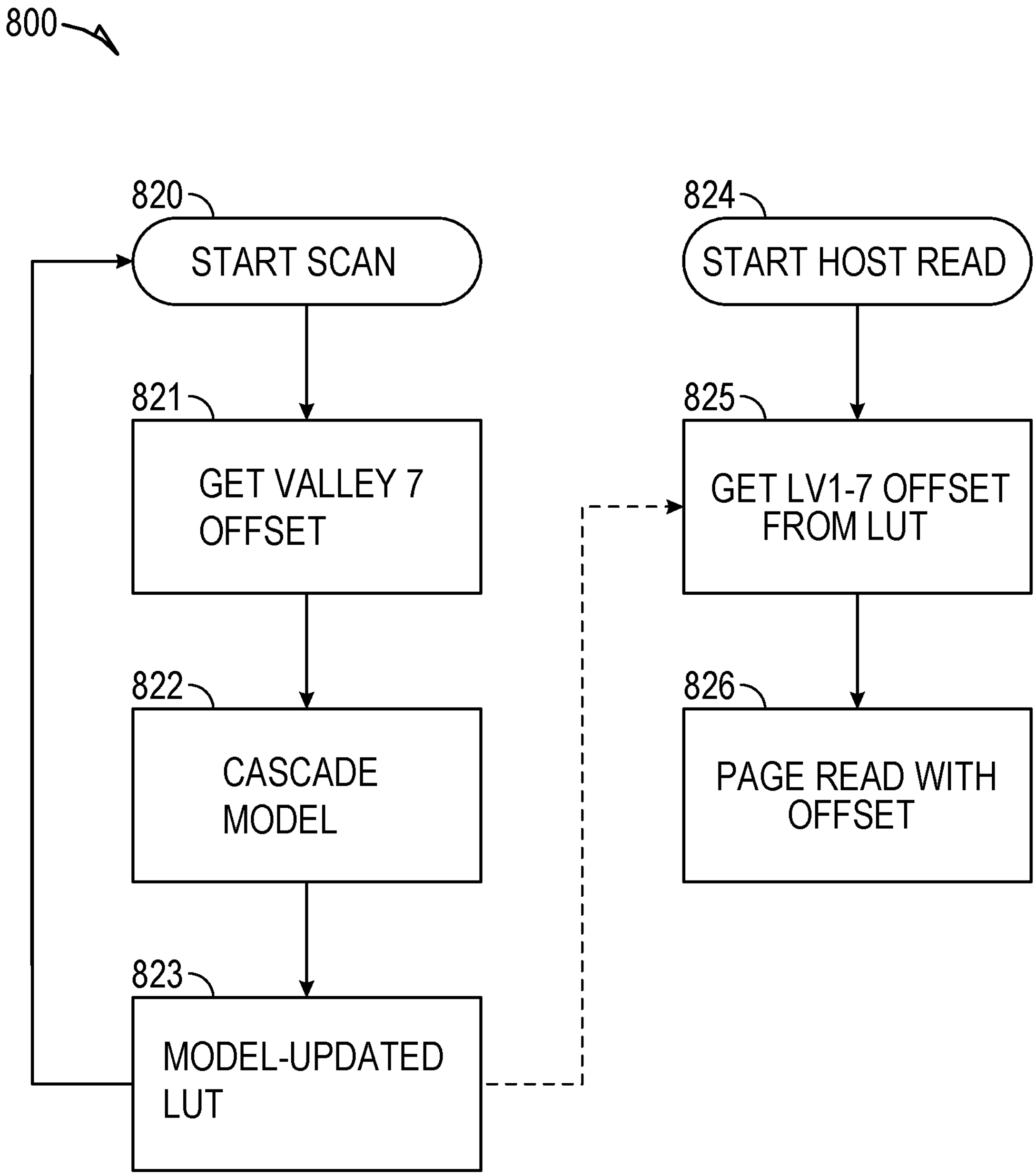
FIG. 8 is a flow diagram of an example method to perform adaptive read level threshold voltage operations, in accordance with some embodiments of the present disclosure.

FIG. 8 is a flow diagram of an example method 800 to perform adaptive read level threshold voltage operations, in accordance with some embodiments of the present disclosure. Method 800 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 800 can performed by the memory sub-system controller 115 or subcomponents of the controller 115 of FIG. 1. In these embodiments, the method 800 can be performed, at least in part, by the cascade model-based read level voltage offset module 113. Although the processes are shown in a particular sequence or order, unless otherwise specified, the order of the processes can be modified. Thus, the illustrated embodiments should be understood only as examples; the illustrated processes can be performed in a different order, and some processes can be performed in parallel. Additionally, one or more processes can be omitted in various embodiments. Thus, not all processes are required in every embodiment. Other process flows are possible.

Referring now to FIG. 8, at operation 820, a scan operation is performed to compute or determine a select read level voltage offset for a select read level voltage at operation 821, such as the read level voltage offset for read level 7. Then, at operation 822, a cascade model is accessed and used to determine one or more predicted read level voltage offsets using the determined select read level voltage offset for the select read level voltage obtained at operation 821. A look-up table that lists various read level voltage offsets for different read level voltages (e.g., associated with one or more attributes of the memory sub-system or components) can be updated based on the predicted read level voltage offsets and the determined select read level voltage offset at operation 823. The cascade model-based read level voltage offset module 113 can then receive a host read operation at operation 824 and, in response, the cascade model-based read level voltage offset module 113, at operation 825, can access the dynamically updated look-up table to retrieve the current read level voltage offsets for the memory cell (e.g., the memory page, block, or portion) being read by the host. The memory cell can be read at operation 826 by the cascade model-based read level voltage offset module 113 using the read level voltage offset obtained from the look-up table that was dynamically updated using the cascade model.

Figure 9:
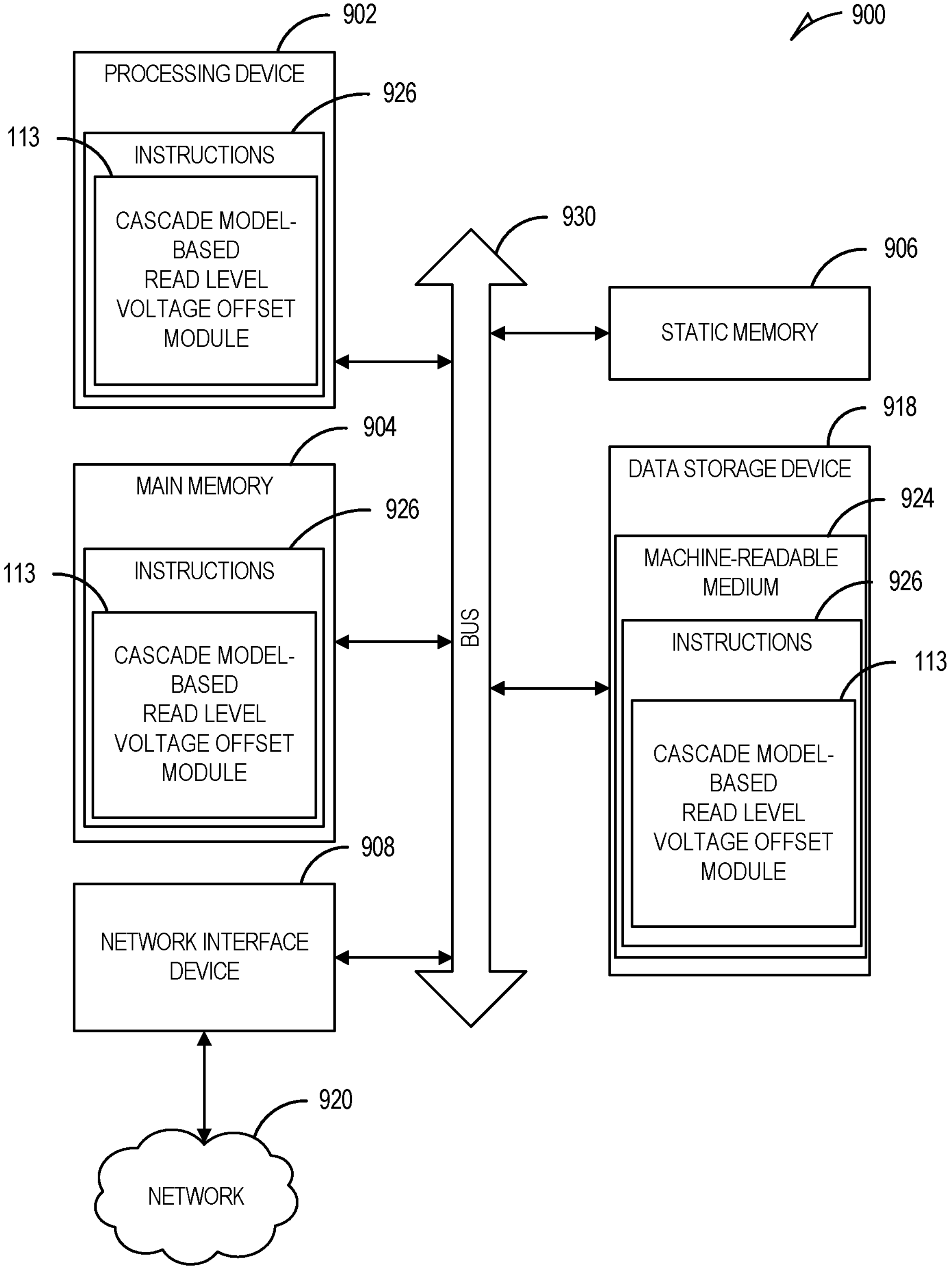
FIG. 9 illustrates an example machine in the form of a computer system within which a set of instructions can be executed for causing the machine to perform any one or more of the methodologies discussed herein.

FIG. 9 illustrates an example machine in the form of a computer system 900 within which a set of instructions can be executed for causing the machine to perform any one or more of the methodologies discussed herein. In some embodiments, the computer system 900 can correspond to a host system (e.g., the host system 120 of FIG. 1) that includes, is coupled to, or utilizes a memory sub-system (e.g., the memory sub-system 110 of FIG. 1) or can be used to perform the operations described herein. In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., ROM, flash memory, DRAM such as SDRAM or Rambus DRAM (RDRAM), etc.), a static memory 906 (e.g., flash memory, static random-access memory (SRAM), etc.), and a data storage device 918, which communicate with each other via a bus 930.

The processing device 902 represents one or more general-purpose processing devices such as a microprocessor, a central processing unit, or the like. More particularly, the processing device 902 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 902 can also be one or more special-purpose processing devices such as an application-specific integrated circuit (ASIC), a field programmable gate array (FPGA), a digital signal processor (DSP), a network processor, or the like. The processing device 902 is configured to execute instructions 926 for performing the operations and steps discussed herein. The computer system 900 can further include a network interface device 908 to communicate over a network 920.

The data storage device 918 can include a machine-readable storage medium 924 (also known as a computer-readable medium) on which is stored one or more sets of instructions 926 or software embodying any one or more of the methodologies or functions described herein. The machine-readable storage medium 924 can be non-transitory in nature. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage device 918, and/or main memory 904 can correspond to the memory sub-system 110 of FIG. 1.

In one embodiment, the instructions 926 include instructions to implement functionality corresponding to using a cascade model to determine one or more read level voltage offsets used to read data from one or more memory cells of a memory device as described herein (e.g., the cascade model-based read level voltage offset module 113 of FIG. 1). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to convey the substance of their work most effectively to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory components, and so forth.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
- a memory device comprising a plurality of wordline groups, each of the plurality of wordline groups comprising memory cells; and
- a memory controller operatively coupled to the memory device, the memory controller performing operations comprising:
  - determining a select read level voltage offset for a select read level voltage used to read data from memory cells of a select wordline group of the plurality of wordline groups;
  - determining, by a wordline group machine-learning model, a plurality of predicted select read level voltage offsets for the select read level voltage used to read data from memory cells of other wordline groups of the plurality of wordline groups, each of the plurality of predicted select read level voltage offsets being determined based on the select read level voltage offset;
  - based on the plurality of predicted select read level voltage offsets and the select read level voltage offset, determining, by a plurality of read level machine-learning models stacked in a cascade structure, a plurality of predicted other read level voltage offsets for other read level voltages used to read data from memory cells of at least one wordline group of the plurality of wordline groups, each of the plurality of read level machine-learning models:
    - receiving, as input, a respective one of the plurality of predicted select read level voltage offsets output by the wordline group machine-learning model; and
    - determining a set of predicted read level voltage offsets for a respective wordline group of the plurality of wordline groups; and
  - updating, based on the plurality of predicted select read level voltage offsets and the plurality of predicted other read level voltage offsets, a look-up table that comprises a set of read level voltage offsets used with one or more read level voltages to read data from one or more memory cells of the plurality of wordline groups.

2. The system of claim 1, wherein the select read level voltage offset is determined by:
- performing a scan operation on at least one memory cell of the select wordline group to determine the select read level voltage offset.

3. The system of claim 2, wherein the scan operation comprises:
- applying different read level voltages to the at least one memory cell;
- determining whether an individual one of the different read level voltages reaches a center of valley; and
- determining that the select read level voltage offset has been reached in response to determining that the individual one of the different read level voltages reaches the center of valley.

4. The system of claim 1, wherein the wordline group machine-learning model comprises at least one of an artificial neural network or a linear regression model.

5. The system of claim 1, wherein each of the plurality of read level machine-learning models comprises at least one of an artificial neural network or a linear regression model.

6. The system of claim 1, wherein the wordline group machine-learning model and the plurality of read level machine-learning models are trained during manufacture of the system.

7. The system of claim 1, wherein the select read level voltage corresponds to a highest read level voltage used to read data from memory cells of the plurality of wordline groups.

8. The system of claim 7, wherein the other read level voltages correspond to lower read level voltages used to read data from memory cells of the plurality of wordline groups.

9. The system of claim 1, wherein the look-up table comprises a plurality of tables each corresponding to a different wordline group of the plurality of wordline groups.

10. The system of claim 1, wherein the set of read level voltage offsets of the look-up table is organized according to bins, and wherein the updating of the look-up table based on the plurality of predicted select read level voltage offsets and the plurality of predicted other read level voltage offsets comprises:
- identifying a plurality of bins of the look-up table corresponding to the select read level voltage offset; and
- replacing, in the set of read level voltage offsets, values of the plurality of bins with respective ones of the plurality of predicted other read level voltage offsets.

11. The system of claim 1, wherein the operations are performed periodically to update the look-up table.

12. The system of claim 1, wherein each of the memory cells is a triple-level cell (TLC) or a quad-level cell (QLC).

13. A method comprising:
- determining a select read level voltage offset for a select read level voltage used to read data from memory cells of a select wordline group of a plurality of wordline groups of a memory device;
- determining, by a wordline group machine-learning model, a plurality of predicted select read level voltage offsets for the select read level voltage used to read data from memory cells of other wordline groups of the plurality of wordline groups, each of the plurality of predicted select read level voltage offsets being determined based on the select read level voltage offset;
- based on the plurality of predicted select read level voltage offsets and the select read level voltage offset, determining, by a plurality of read level machine-learning models stacked in a cascade structure, a plurality of predicted other read level voltage offsets for other read level voltages used to read data from memory cells of at least one wordline group of the plurality of wordline groups, each of the plurality of read level machine-learning models:

receiving, as input, a respective one of the plurality of predicted select read level voltage offsets output by the wordline group machine-learning model; and determining a set of predicted read level voltage offsets for a respective wordline group of the plurality of wordline groups; and updating, based on the plurality of select predicted read level voltage offsets and the plurality of predicted other read level voltage offsets, a look-up table that comprises a set of read level voltage offsets used with one or more read level voltages to read data from one or more memory cells of the plurality of wordline groups.

14. The method of claim 13, wherein the wordline group machine-learning model is associated with a wordline group attribute of the memory device.

15. The method of claim 13, wherein the cascade structure comprises one or more machine-learning models associated with an operating temperature of the memory device.

16. The method of claim 13, wherein the cascade structure comprises one or more machine-learning models associated with an elapsed programming time of data of the memory device.

17. The method of claim 13, wherein the cascade structure comprises one or more machine-learning models associated with a program erase count of the memory device.

18. The method of claim 13, wherein the look-up table comprises a plurality of tables each corresponding to a different set of memory cell attributes.

19. A non-transitory computer-readable storage medium comprising instructions that, when executed by a processing device, cause the processing device to perform operations comprising:

determining a select read level voltage offset for a select read level voltage used to read data from memory cells of a select wordline group of a plurality of wordline groups of a memory device;

determining, by a wordline group machine-learning model, a plurality of predicted select read level voltage offsets for the select read level voltage used to read data from memory cells of other wordline groups of the plurality of wordline groups, each of the plurality of predicted select read level voltage offsets being determined based on the select read level voltage offset;

based on the plurality of predicted select read level voltage offsets and the select read level voltage offset, determining, by a plurality of read level machine-learning models stacked in a cascade structure, a plurality of predicted other read level voltage offsets for other read level voltages used to read data from memory cells of at least one wordline group of the plurality of wordline groups, each of the plurality of read level machine-learning models:

receiving, as input, a respective one of the plurality of predicted select read level voltage offsets output by the wordline group machine-learning model; and determining a set of predicted read level voltage offsets for a respective wordline group of the plurality of wordline groups; and updating, based on the plurality of select predicted read level voltage offsets and the plurality of predicted other read level voltage offsets, a look-up table that comprises a set of read level voltage offsets used with one or more read level voltages to read data from one or more memory cells of the plurality of wordline groups.

20. The non-transitory computer-readable storage medium of claim 19, wherein the select read level voltage offset is determined by:

performing a scan operation on at least one memory cell of the select wordline group to determine the select read level voltage offset.

* * * * *